US010025195B2

(12) United States Patent
Kawabe

(10) Patent No.: US 10,025,195 B2
(45) Date of Patent: Jul. 17, 2018

(54) REFLECTIVE IMAGE-FORMING OPTICAL SYSTEM, EXPOSURE APPARATUS, AND DEVICE MANUFACTURING METHOD

(71) Applicant: NIKON CORPORATION, Tokyo (JP)

(72) Inventor: Yoshio Kawabe, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/401,202

(22) Filed: Jan. 9, 2017

(65) Prior Publication Data

US 2017/0115574 A1 Apr. 27, 2017

Related U.S. Application Data

(60) Division of application No. 14/451,699, filed on Aug. 5, 2014, now Pat. No. 9,541,842, which is a
(Continued)

(30) Foreign Application Priority Data

Feb. 6, 2012 (JP) .................................. 2012-023167

(51) Int. Cl.
*G03B 27/54* (2006.01)
*G03F 7/20* (2006.01)
(Continued)

(52) U.S. Cl.
CPC ......... *G03F 7/702* (2013.01); *G02B 17/0657* (2013.01); *G02B 19/0023* (2013.01); *G02B 19/0095* (2013.01); *G03F 7/70233* (2013.01)

(58) Field of Classification Search
CPC .............................. G03F 7/702; G03F 7/70233
(Continued)

(56) References Cited

U.S. PATENT DOCUMENTS 5,956,192 A 9/1999 Williamson
6,109,756 A * 8/2000 Takahashi .......... G02B 17/0657
359/365
(Continued)

FOREIGN PATENT DOCUMENTS

JP 2000-91209 A 3/2000
JP 2000-98229 A 4/2000
(Continued)

OTHER PUBLICATIONS

Sep. 13, 2016 Office Action issued in Japanese Patent Application No. 2013-557471.
(Continued)

*Primary Examiner* — Hung Henry Nguyen
(74) *Attorney, Agent, or Firm* — Oliff PLC

(57) ABSTRACT

A reflective imaging optical system which forms, on a second plane, an image of a pattern arranged on a first plane and illuminated with light from an illumination optical system includes a plurality of reflecting mirrors including first and second reflecting mirrors by which the light reflected by the first plane is reflected first, second, respectively. An area on the first plane illuminated with the light from the illumination optical system is an illumination objective area, the illumination objective area is positioned on a predetermined side of an optical axis of the reflecting mirrors, and reflection areas of the first and second reflecting mirrors are positioned on the predetermined side of the optical axis of the reflecting mirrors; and the first and second reflecting mirrors are arranged so that an optical path of the light from the illumination optical system is positioned between the first and second reflecting mirrors.

20 Claims, 7 Drawing Sheets

Related U.S. Application Data continuation of application No. PCT/JP2013/051961, filed on Jan. 30, 2013.

(51) Int. Cl.
 *G02B 17/06* (2006.01)
 *G02B 19/00* (2006.01)

(58) Field of Classification Search
 USPC .................. 355/52, 53, 55, 67–71; 359/850
 See application file for complete search history.

(56) References Cited

U.S. PATENT DOCUMENTS

| | | | |
|---|---|---|---|
| 6,266,389 | B1 | 7/2001 | Murayama et al. |
| 6,781,671 | B2 | 8/2004 | Komatsuda |
| 8,743,342 | B2 | 6/2014 | Ono |
| 9,541,842 | B2 * | 1/2017 | Kawabe .............. G03F 7/70233 |
| 2002/0093636 | A1 | 7/2002 | Komatsuda |
| 2005/0094257 | A1 * | 5/2005 | Sasaki ................ G02B 17/0657 359/366 |
| 2006/0232867 | A1 | 10/2006 | Mann et al. |
| 2007/0046918 | A1 * | 3/2007 | Takahashi .......... G02B 17/0657 355/67 |
| 2007/0058269 | A1 | 3/2007 | Mann et al. |
| 2007/0223112 | A1 | 9/2007 | Mann et al. |
| 2007/0296936 | A1 | 12/2007 | Kato |
| 2008/0024746 | A1 | 1/2008 | Mann |
| 2009/0051890 | A1 | 2/2009 | Mann et al. |
| 2009/0052073 | A1 | 2/2009 | Mann et al. |
| 2009/0122381 | A1 | 5/2009 | Owa et al. |
| 2010/0149509 | A1 * | 6/2010 | Shiraishi ................ G02B 5/005 355/71 |
| 2011/0109890 | A1 | 5/2011 | Komatsuda |
| 2011/0122384 | A1 | 5/2011 | Mann |
| 2011/0165522 | A1 | 7/2011 | Mann et al. |
| 2012/0008125 | A1 | 1/2012 | Mann |
| 2012/0062864 | A1 | 3/2012 | Kawabe |
| 2013/0128248 | A1 | 5/2013 | Komatsuda et al. |
| 2013/0271749 | A1 * | 10/2013 | Korb ................... G03F 7/70483 356/51 |

FOREIGN PATENT DOCUMENTS

| | | |
|---|---|---|
| JP | 2010-539717 A | 12/2010 |
| JP | 2011-150227 A | 8/2011 |
| WO | 2009/036975 A1 | 3/2009 |
| WO | 2009/125530 A1 | 10/2009 |

OTHER PUBLICATIONS

Sep. 7, 2016 Notice of Allowance issued in U.S. Appl. No. 14/451,699.
International Search Report issued in International Patent Application No. PCT/JP2013/051961 dated Mar. 19, 2013.
International Preliminary Report on Patentability issued in International Patent Application No. PCT/JP2013/051961 dated Aug. 12, 2014.
Feb. 22, 2018 Office Action issued in Japanese Application No. 2017-087344.

* cited by examiner

REFLECTIVE IMAGE-FORMING OPTICAL SYSTEM, EXPOSURE APPARATUS, AND DEVICE MANUFACTURING METHOD

CROSS-REFERENCE TO RELATED APPLICATIONS

This is a Divisional of U.S. patent application Ser. No. 14/451,699 filed Aug. 5, 2014 (now U.S. Pat. No. 9,541,842), which in turn is a Continuation of International Application No. PCT/JP2013/051961 filed Jan. 30, 2013, which claims the conventional priority of Japanese Patent Application No. 2012-023167 filed on Feb. 6, 2012 and titled "Reflective Imaging Optical System, Exposure Apparatus, and Method for Producing Device". The disclosures of each of the prior applications is incorporated herein by reference in its entirety.

BACKGROUND

Field of the Invention

The present invention relates to a reflective (catoptric) imaging optical system, an exposure apparatus, and a method for producing a device. More specifically, the present invention relates to a reflective imaging optical system suitable for an exposure apparatus which uses, for example, the EUV light (EUV light beam) and transfers, onto a photosensitive substrate, a circuit pattern on a mask in accordance with the mirror projection method.

Description of the Related Art

Attention is directed to an EUVL (Extreme UltraViolet Lithography) exposure apparatus which uses the EUV (Extreme UltraViolet) light having a wavelength of, for example, about 5 nm to 40 nm as an exposure apparatus to be used for producing semiconductor elements, etc. In a case that the EUV light is used as the exposure light (exposure light beam), any usable transmissive optical material and any useable dioptric optical material are absent. Therefore, a reflection type mask is used, and a reflective optical system (optical system constructed of only reflecting members) is used as a projection optical system.

Conventionally, it has been suggested that a reflective optical system, which has an entrance pupil disposed on a side opposite to the optical system with an object plane intervening therebetween (an entrance pupil disposed on a side opposite to the optical system with respect to an object plane), is used as a reflective imaging optical system applicable to a projection optical system of an EUV exposure apparatus, in place of a reflective optical system which has an entrance pupil disposed on a side of the optical system with respect to an object plane (see, for example, U.S. Pat. No. 6,781,671). In the following description of this specification, the "reflective imaging optical system having the entrance pupil disposed on the side of the optical system with respect to the object plane" is referred to as "reflective imaging optical system of the near pupil type", and the "reflective imaging optical system having the entrance pupil disposed on the side opposite to the optical system with respect to the object plane" is referred to as "reflective imaging optical system of the far pupil type". The former is also referred to as "reflective imaging optical system of the normal pupil type" and the latter is also referred to as "reflective imaging optical system of the opposite pupil type".

SUMMARY

In a case that a conventional reflective imaging optical system of the far pupil type is applied to the EUV exposure apparatus, an angle formed by the optical path of light coming into an oblique incidence mirror (flat mirror) of an illumination optical system and the optical axis of the reflective imaging optical system is relatively large. As a result, the size or dimension of footprint (installation area) of the EUV exposure apparatus in the scanning direction is relatively large, which increases the cost of manufacture, installation, and the like of the apparatus.

The aspects of the present teaching have been made taking the foregoing problems into consideration, an object of which is to provide a reflective imaging optical system which can reduce the footprint of an exposure apparatus to which the reflective imaging optical system is applied. The exposure apparatus may be an exposure apparatus using, for example, the EUV light. Further, another object of the present teaching is to perform the projection exposure at a high resolution while securing a large resolving power by applying the reflective imaging optical system of the present teaching to a projection optical system of an exposure apparatus and using, for example, the EUV light as an exposure light.

In order to solve the problems as described above, according to a first embodiment of the present teaching, there is provided a reflective imaging optical system which forms, on a second plane, an image of a pattern arranged on a first plane and illuminated with light from an illumination optical system, the reflective imaging optical system comprising:

a plurality of reflecting mirrors including a first reflecting mirror by which the light reflected by the first plane is reflected first, and a second reflecting mirror by which the light reflected by the first plane is reflected second, wherein an area on the first plane illuminated with the light from the illumination optical system is an illumination objective area, the illumination objective area is positioned on a predetermined side with respect to an optical axis of the plurality of reflecting mirrors, and a reflection area of the first reflecting mirror and a reflection area of the second reflecting mirror are positioned on the predetermined side with respect to the optical axis of the plurality of reflecting mirrors; and the first reflecting mirror and the second reflecting mirror are arranged so that an optical path of the light from the illumination optical system is positioned between the first reflecting mirror and the second reflecting mirror.

According to a second embodiment of the present teaching, there is provided a reflective imaging optical system which forms, on a second plane, an image of a pattern arranged on a first plane and illuminated with light from an illumination optical system, the reflective imaging optical system comprising:

a plurality of reflecting mirrors including a first reflecting mirror by which the light reflected by the first plane is reflected first, a second reflecting mirror by which the light reflected by the first plane is reflected second, and a third reflecting mirror by which the light reflected by the first plane is reflected third, wherein the first reflecting mirror and the second reflecting mirror are arranged so that an optical path of the light from the illumination optical system is positioned between a reflection area of the first reflecting mirror and a reflection area of the second reflecting mirror; and an area on the first plane illuminated with the light from the illumination optical system is an illumination objective area, the illumination objective area is positioned on a predetermined side with respect to an optical axis of the plurality of reflecting mirrors, and the third reflecting mirror is arranged on the predetermined side with respect to the optical axis of the plurality of reflecting mirrors.

According to a third embodiment of the present teaching, there is provided an exposure apparatus, comprising:

an illumination optical system which illuminates a pattern arranged on a first plane with light from a light source; and the reflective imaging optical system as defined in the first embodiment or the second embodiment which projects the pattern on the first plane on a photosensitive substrate disposed on the second plane.

According to a fourth embodiment of the present teaching, there is provided a method for producing a device, comprising:

exposing a photosensitive substrate with a pattern by using the exposure apparatus as defined in the third embodiment;

developing the photosensitive substrate to which the pattern has been transferred to form a mask layer, which has a shape corresponding to the pattern, on a surface of the photosensitive substrate; and processing the surface of the photosensitive substrate via the mask layer.

DESCRIPTION OF THE EMBODIMENTS

Figure 1:
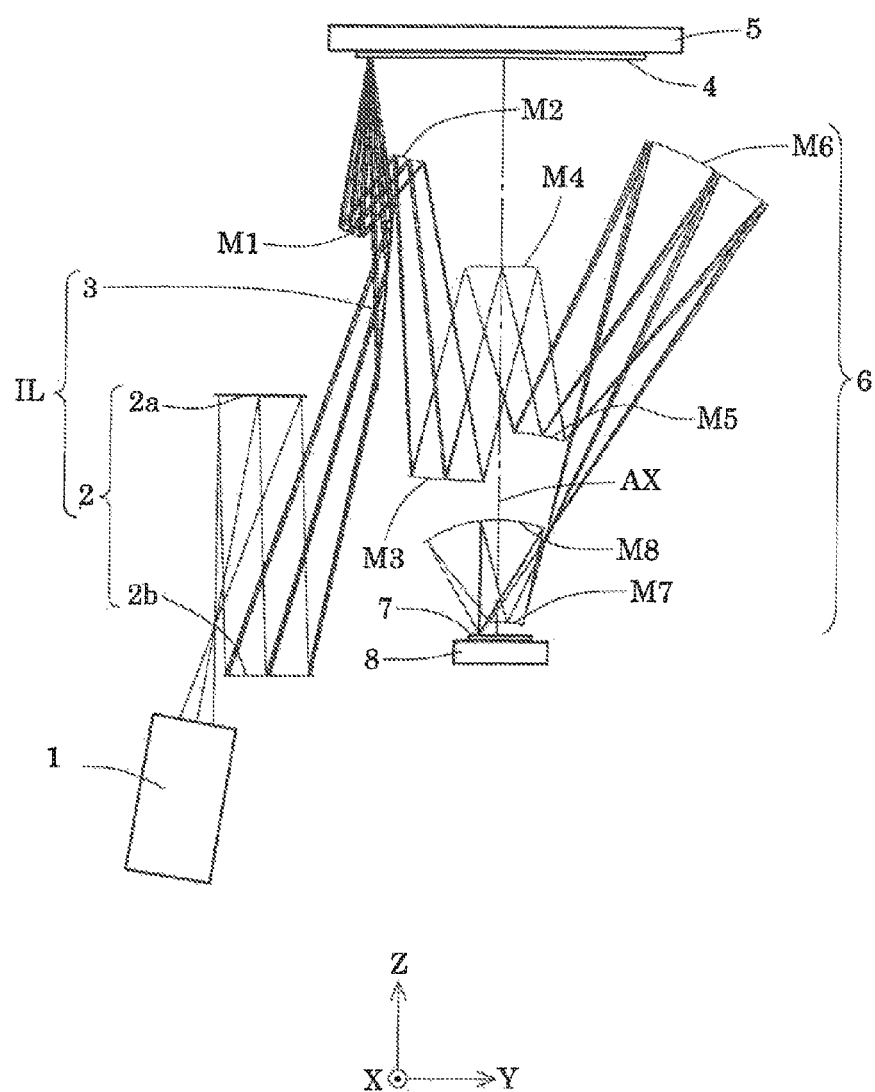
FIG. 1 schematically shows a construction of an exposure apparatus according to an embodiment of the present teaching.
Figure 2:
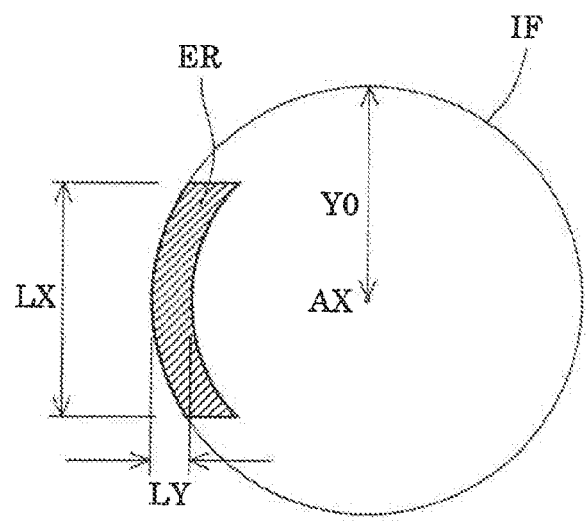
FIG. 2 shows a positional relationship between an optical axis and a circular arc-shaped effective imaging area formed on a wafer.
Figure 2:
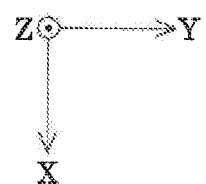

In the following, an embodiment of the present teaching will be explained based on the accompanying drawings. FIG. 1 schematically shows a construction of an exposure apparatus according to the embodiment of the present teaching. FIG. 2 shows a positional relationship between an optical axis and a circular arc-shaped effective imaging area formed on a wafer. In FIG. 1, the Z axis is defined in the direction of the optical axis AX of a reflective imaging optical system 6, i.e., in the normal direction of an exposure surface (transfer surface) of a wafer 7 provided as a photosensitive substrate, the Y axis is defined in the direction parallel to the sheet surface of FIG. 1 in the exposure surface of the wafer 7, and the X axis is defined in the direction perpendicular to the sheet surface of FIG. 1 in the exposure surface of the wafer 7. A first direction and a predetermined direction correspond to, for example, a direction parallel to the Y axis (Y axis direction).

With reference to FIG. 1, a light source 1 which is provided to supply the exposure light includes, for example, a laser plasma X-ray source. Those usable as the light source 1 include discharge plasma light sources and other X-ray sources. The light (light beam) radiated from the light source 1 comes into an illumination optical system IL, via an optionally arranged wavelength selective filter (not shown). The wavelength selective filter has such a characteristic that only the EUV light having a predetermined wavelength (for example, 13.4 nm), which is included in the lights supplied by the light source 1, is selectively transmitted through the wavelength selective filter, and the transmission of the lights having other wavelengths is shielded or shut off by the wavelength selective filter.

The EUV light allowed to pass through the wavelength selective filter is guided to an optical integrator 2 constructed of a pair of fly's eye optical systems (fly's eye mirrors) 2a, 2b. Note that instead of providing the wavelength selective filter, it is allowable to form a multi-layered film, which reflects only a EUV light having a predetermined wavelength, on a reflecting surface of a mirror which reflects or collects generated EUV light. In this case, there is no need to provide any wavelength selective filter, and thus it is possible to achieve a compact-sized light source 1. Further, it is possible to prevent the light amount loss in the EUV light in the wavelength selective filter.

The first fly's eye optical system 2a has a plurality of first reflecting optical elements which are arranged in juxtaposition or in parallel. The second fly's eye optical system 2b has a plurality of second reflecting optical elements which are arranged in juxtaposition or in parallel to correspond to the plurality of first reflecting optical elements of the first fly's eye optical system 2a. Specifically, the first fly's eye optical system 2a is constructed, for example, by arranging a large number of concave mirror elements, having circular arc-shaped outer shapes, densely, laterally and longitudinally. The second fly's eye optical system 2b is constructed, for example, by arranging a large number of concave mirror elements, which have rectangular outer shapes, densely, laterally and longitudinally. Reference may be made, for example, to United States Patent Application Publication No. 2002/0093636 A1 about detailed construction and function of the fly's eye optical systems 2a, 2b. The contents of United States Patent Application Publication No. 2002/0093636 A1 are incorporated herein by reference in their entirety.

Thus, a substantial surface light source, which has a predetermined shape, is formed in the vicinity of the reflecting surface of the second fly's eye optical system 2b. The substantial surface light source is formed at the position of the exit pupil (exit pupil position) of the illumination optical system IL constructed of the pair of fly's eye optical systems 2a, 2b. The exit pupil position of the illumination optical system IL (i.e., the position in the vicinity of the reflecting surface of the second fly's eye optical system 2b) is coincident with the position of the entrance pupil of the reflective imaging optical system (projection optical system) 6 of the far pupil type.

The light from the substantial surface light source, i.e., the light exiting or irradiated from the optical integrator 2 comes into a flat mirror 3 which functions as an oblique incidence mirror. The light reflected by the flat mirror 3 passes between a first reflecting mirror M1 and a second reflecting mirror M2 of the reflective imaging optical system 6, and then forms a circular arc-shaped illumination area (illumination objective area) on the mask 4 via a circular arc-shaped aperture (light-transmitting portion) of a field stop (not shown) which is arranged closely to the reflection type mask 4 substantially in parallel thereto.

In this way, the optical integrator 2 (2a, 2b) and the flat mirror 3 constitute the illumination optical system IL which is provided to perform the Koehler illumination for the mask 4 provided with a predetermined pattern by use of the light from the light source 1. No reflecting mirror having any power is arranged in the optical path between the second fly's eye optical system 2b and the mask 4. The power of the reflecting mirror is a reciprocal of the focal length or focal distance of the concerning reflecting mirror. It is allowable that the reflecting mirror having any power may be arranged in the optical path between the second fly's eye optical system 2b and the mask 4.

The mask 4 is held by a mask stage 5 which is movable in the Y direction so that the pattern surface of the mask 4 extends along the XY plane. The movement of the mask stage 5 is measured by a laser interferometer and an encoder which are omitted from the illustration. For example, a circular arc-shaped illumination area, which is symmetrical in relation to the Y axis, is formed on the mask 4. The light, which comes from the illuminated mask 4, forms a pattern image of the mask 4 on a wafer 7 as a photosensitive substrate, via the reflective imaging optical system 6.

That is, as shown in FIG. 2, a circular arc-shaped effective imaging area (static exposure area) ER, which is symmetrical in relation to the Y axis, is formed on the wafer 7. With reference to FIG. 2, the circular arc-shaped effective imaging area ER, which has a length LX in the X direction and a length LY in the Y direction, is formed in the circular area (image circle) IF which has the optical axis AX as the center and has a radius Y0, in a manner that the effective imaging area ER is in contact with the image circle IF. The circular arc-shaped effective imaging area ER is a part of the annular or zonal area provided about the center of the optical axis AX. The length LY is the widthwise dimension of the effective imaging area ER provided in the direction connecting the optical axis and the center of the circular arc-shaped effective imaging area ER.

The wafer 7 is held by a wafer stage 8 which is two-dimensionally movable in the X direction and the Y direction so that the exposure surface of the wafer 7 extends along the XY plane. The movement of the wafer stage 8 is measured by a laser interferometer and an encoder which are omitted from the illustration, in the same manner as the mask stage 5. Thus, the scanning exposure (scanning and exposure) is performed while the mask stage 5 and the wafer stage 8 are moved in the Y direction, i.e., the mask 4 and the wafer 7 are relatively moved in the Y direction with respect to the reflective imaging optical system 6. By doing so, the pattern of the mask 4 is transferred to an exposure area of the wafer 7.

In a case that the projection magnification (transfer magnification) of the reflective imaging optical system 6 is ⅛, the synchronous scanning is performed by setting the movement velocity of the wafer stage 8 to ⅛ of the movement velocity of the mask stage 5. The pattern of the mask 4 is successively transferred to respective exposure areas of the wafer 7 by repeating the scanning exposure while the wafer stage 8 is two-dimensionally moved in the X direction and the Y direction. The projection magnification of the reflective imaging optical system 6 may be ⅙, ¼, or the like. For example, in a case that the projection magnification of the reflective imaging optical system 6 is ⅙, the movement velocity of the wafer stage 8 is set to ⅙ of the movement velocity of the mask stage 5. In a case that the projection magnification of the reflective imaging optical system 6 is ¼, the movement velocity of the wafer stage 8 is set to ¼ of the movement velocity of the mask stage 5.

Figure 3:
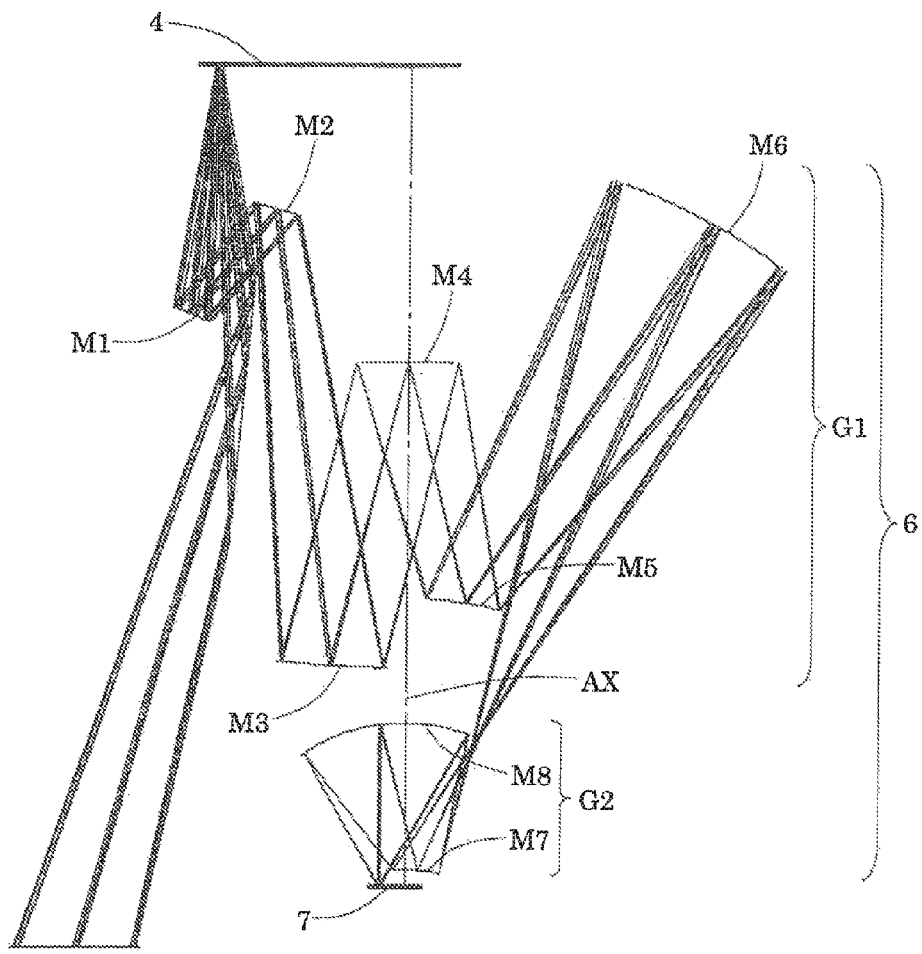
FIG. 3 schematically shows a construction of a reflective imaging optical system according to a first embodiment of the present teaching.
Figure 4:
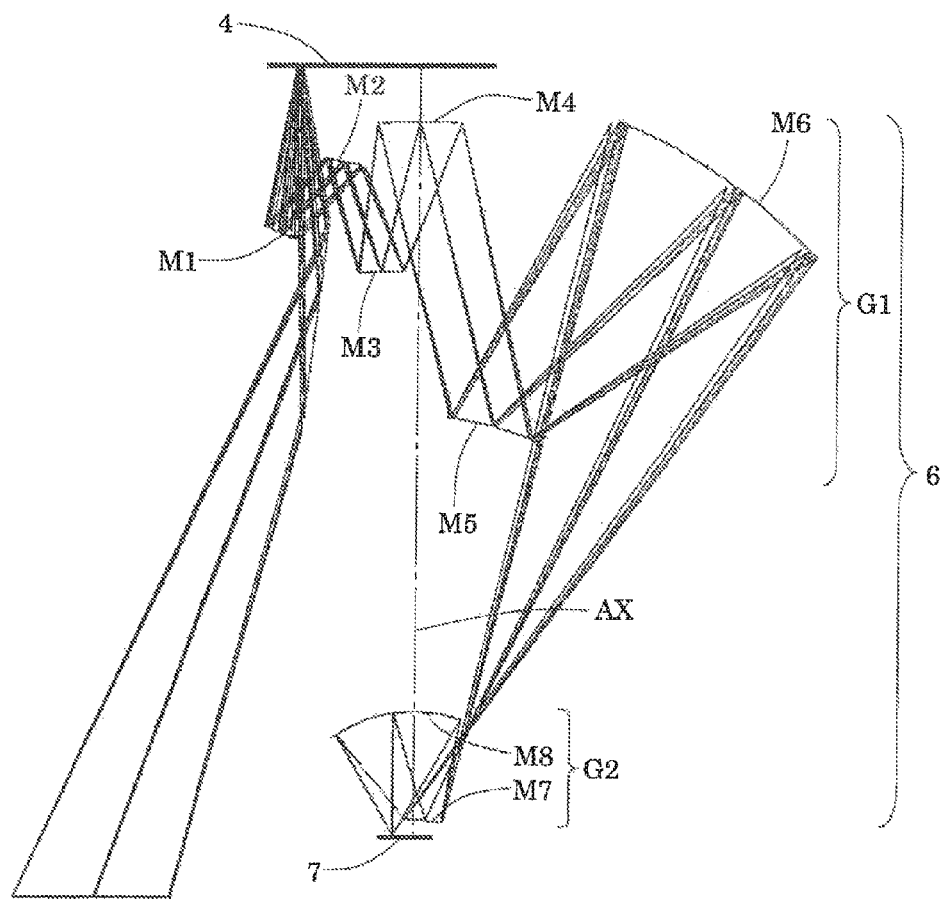
FIG. 4 schematically shows a construction of a reflective imaging optical system according to a second embodiment of the present teaching.
Figure 4:
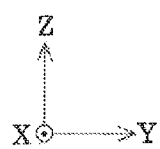

In the embodiment of the present teaching, as shown in FIGS. 3 and 4, the reflective imaging optical system 6 concerning each of embodiments includes, along the single optical axis AX extending in a form of straight line, a first reflective optical system G1 which forms an intermediate image of the pattern at a position optically conjugate with the pattern surface of the mask 4 (hereinafter referred also to as "mask surface"), and a second reflective optical system G2 which forms, on a transfer surface of the wafer 7 (hereinafter referred also to as "wafer surface"), a final reduced image (image of the intermediate image) of the pattern of the mask 4. That is, the position, which is optically conjugate with the illumination area on the pattern surface of the mask 4, is formed in the optical path between the first reflective optical system G1 and the second reflective optical system G2. The reflective imaging optical system 6 may be constructed only of the first reflective optical system G1 or may be constructed by use of a plurality of optical systems such as a third reflective optical system and a fourth reflective optical system.

The first reflective optical system G1 includes the first reflecting mirror M1 which has a concave (concave surface-shaped) reflecting surface, the second reflecting mirror M2 which has a convex (convex surface-shaped) reflecting surface, a third reflecting mirror M3 which has a concave (concave surface-shaped) reflecting surface or a convex (convex surface-shaped) reflecting surface, a fourth reflecting mirror M4 which has a concave (concave surface-shaped) reflecting surface, a fifth reflecting mirror M5 which has a convex (convex surface-shaped) reflecting surface, and a sixth reflecting mirror M6 which has a concave (concave surface-shaped) reflecting surface, as referred to in an order of the incidence of the light (in an order in which they reflect the light travels from the mask 4 toward the wafer 7).

The second reflective optical system G2 includes a seventh reflecting mirror M7 which has a convex (convex surface-shaped) reflecting surface and a eighth reflecting mirror M8 which has a concave (concave surface-shaped) reflecting surface as referred to in an order of the incidence of the light. The reflecting surfaces of respective reflecting mirrors M1 to M8 may be constructed of the reflecting surfaces in a concave-surface shape, a convex-surface shape, plane-surface shape, and other curved shapes, respectively.

In the respective embodiments, an aperture stop AS (not shown) is provided at a position at which the reflecting surface of the fourth reflecting mirror M4 is located or at a position in the vicinity thereof. The aperture stop AS sets the numerical aperture of the reflective imaging optical system 6 by limiting the light flux of the exposure light. For example, the aperture stop AS may be a variable aperture stop capable of adjusting the dimension or size of the aperture (aperture size), or a switching member provided with a plurality of apertures having mutually different size, shape, etc., and capable of choosing a desired aperture from the plurality of apertures.

In the respective embodiments, the light from an illumination area which is separated from the optical axis AX in the −Y direction on the pattern surface of the mask 4 (first plane) is successively reflected by the reflecting surface of the first reflecting mirror M1, the reflecting surface of the second reflecting mirror M2, the reflecting surface of the third reflecting mirror M3, the reflecting surface of the fourth reflecting mirror M4, the reflecting surface of the fifth reflecting mirror M5, and the reflecting surface of the sixth reflecting mirror M6, and then the reflected light forms the intermediate image of the mask pattern. The light from the intermediate image formed via the first reflective optical system G1 is successively reflected by the reflecting surface of the seventh reflecting mirror M7 and the reflecting surface of the eighth reflecting mirror M8, and then the reflected light forms an reduced image of the mask pattern at an effective imaging area ER which is separated from the optical axis AX in the −Y direction on the surface of the wafer 7 (second plane).

Specifically, the magnitude of the imaging magnification of the reflective imaging optical system 6 according to a first embodiment is ⅛, and the magnitude of the imaging magnification of the reflective imaging optical system 6 according to a second embodiment is ⅙. Therefore, the reduced image of ⅛ times the mask pattern is formed at the effective imaging area ER in the first embodiment, and the reduced image of ⅙ times the mask pattern is formed at the effective imaging area ER in the second embodiment.

In the respective embodiments, the eight mirrors which are the first to eighth reflecting mirrors M1 to M8 constructing the reflective imaging optical system 6 are arranged so that the centers of curvature (curvature centers) of the reflecting surfaces of the first to eighth reflecting mirrors M1 to M8 are positioned on the optical axis AX having a form of straight line. The reflecting mirrors M1 to M8 have the aspheric reflecting surfaces each of which is formed along the surface rotationally symmetric about the optical axis AX. In a case that the reflecting surface is formed to be an aspherical surface, it is possible to use the paraxial center of curvature as the center of curvature of the reflecting surface. In the vicinity of the intersection point between the axis of rotational symmetry and the aspherical surface, the aspherical surface may be considered as a spherical surface, and the center of curvature of this spherical surface is referred to as the paraxial center of curvature (apex center of curvature). The reflective imaging optical system 6 may be constructed of, for example, 7 to 12 reflecting mirrors.

In the respective embodiments, the reflective imaging optical system 6 is the optical system which is substantially telecentric on the side of the wafer (on the side of the image). In other words, in the respective embodiments, the main light beam, which arrives at the respective positions on the image plane of the reflective imaging optical system 6, is substantially perpendicular to the image plane. Owing to this construction, the imaging can be performed satisfactorily even when irregularities (protrusions and recesses) within the depth of focus of the reflective imaging optical system 6 exists on the wafer. The reflective imaging optical system 6 concerning each of the embodiments is the reflective imaging optical system of the far pupil type which has the entrance pupil, at the position separated from the reflective imaging optical system by a predetermined distance, the position being on the side opposite to the reflective imaging optical system 6 with respect to the mask 4.

In this embodiment, the light reflected by the flat mirror 3 of the illumination optical system IL passes between the first reflecting mirror M1 and the second reflecting mirror M2, and then forms a circular arc-shaped illumination area which is separated from the optical axis AX in the −Y direction on the mask 4. That is, the first reflecting mirror M1 and the second reflecting mirror M2 are arranged so that the optical path of the light coming from the illumination optical system IL is positioned therebetween. Further, the reflection area of the first reflecting mirror M1 and the reflection area of the second reflecting mirror M2 are positioned in the −Y direction of the optical axis AX. Here, the "reflection area" can mean the radiation area of light which is formed on the reflecting surface of a reflecting mirror by the light coming into the reflecting mirror. In a case that the radiation area of the light which is formed on the reflecting surface of a reflecting mirror by the light coming into the reflecting mirror is changed depending on the illumination conditions and the like, a maximum radiation area can be regarded as the "reflection area". In a case that there are a plurality of radiation areas of the light which are formed on the reflecting surface of a reflecting mirror by the light coming into the reflecting mirror, the area, which includes all of the plurality of radiation areas on the reflecting surface and has a minimum area or dimension, may be regarded as the "reflection area". In particular, in the respective embodiments, the first reflecting mirror M1 to the third reflecting mirror M3 are positioned in the −Y direction of the optical axis AX, and the reflection area of the first reflecting mirror M1 is formed to be farther away from the optical axis AX than the reflection area of the second reflecting mirror M2.

Accordingly, in this embodiment, the angle formed by the optical path of light coming into the flat mirror 3 of the illumination optical system IL and the optical axis AX of the reflective imaging optical system 6 can be suppressed to be small. Thus, the size of the footprint (installation area) of the EUV exposure apparatus in the scanning direction can be suppressed to be small, thereby making it possible to reduce the cost of manufacture, installation, and the like of the apparatus. In order to make the angle formed by the optical path of the light coming into the flat mirror 3 and the optical axis AX small and in order to make the footprint of the apparatus small, it is preferred that an acute angle formed by the plane formed by extending the reflecting surface of the flat mirror 3 and the flat surface on which the pattern surface of the mask 4 is positioned be set to 60 degrees or more.

The structure of this embodiment in which the first reflecting mirror M1 and the second reflecting mirror M2 are arranged so that the optical path of the light coming from the illumination optical system IL is positioned therebetween is easily obtained by setting the magnitude of the imaging magnification of the reflective imaging optical system 6 to a value smaller than ¼ which is normally used, for example ⅛ or ⅙. The reason thereof is as follows. That is, in a case that the magnitude of the imaging magnification is made to be smaller while the numerical aperture on the image side of the reflective imaging optical system 6 is secured to be required magnitude, the cross-sections of light flux coming into the first reflecting mirror M1 and the second reflecting mirror M2 become smaller and thus it is possible to secure a large space between the first reflecting mirror M1 and the second reflecting mirror M2.

The structure in this embodiment can make the incident angle of the light beam to the flat mirror 3 larger than those of conventional art, and thus the reflectance in the flat mirror 3 which is larger than those of conventional art can be secured. Accordingly, the light amount loss in the flat mirror 3 can be suppressed to be small. Further, since the incident angle of the light beam to the flat mirror 3 is larger than those of conventional art, the uneven illuminance in the Y direction in the illumination area on the mask 4 can be suppressed to be small as shown in FIGS. 5A to 5C.

Figure 5A:
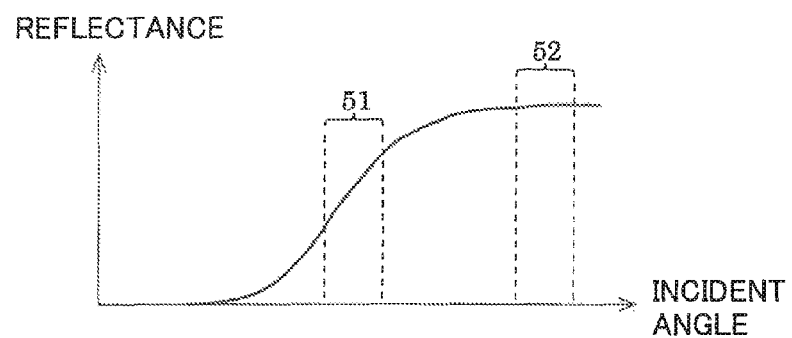
FIGS. 5A to 5C illustrate that uneven illuminance in an illumination area is suppressed to be small in the embodiment.
Figure 5B:
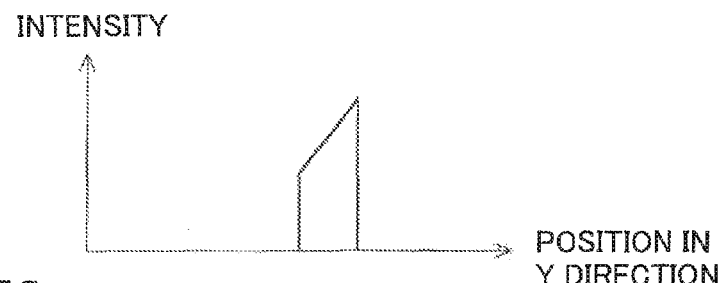
Figure 5C:
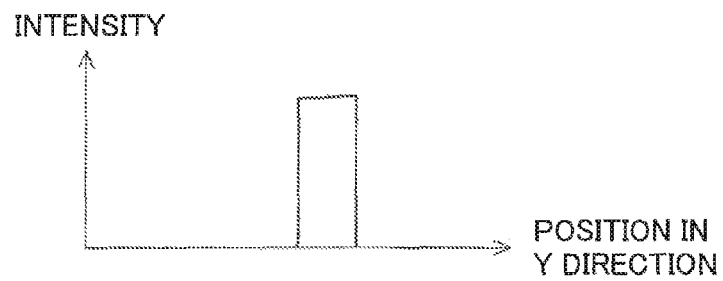

FIG. 5A illustrates the incident angle characteristic of reflectance of the flat mirror. With reference to FIG. 5A, in a case that the flat mirror is used for the light beam in a range 51 of which incident angle is relatively small like conventional art, a relatively great change occurs in the reflectance depending on the incident angle. Thus, as shown in FIG. 5B, there is caused a relatively large uneven illuminance in the Y direction in the illumination area. On the other hand, in a case that the flat mirror 3 is used for the light beam in a range 52 of which incident angle is relatively large like this embodiment, the reflectance substantially stays constant with little dependence on the incident angle. Thus, as shown in FIG. 5C, the uneven illuminance in the Y direction in the illumination area can be suppressed to be small. The reflecting surface of the flat mirror is formed of a single layer film or multi-layer film. By adjusting the number of layers, the thickness of the film, the material of the film, and the like, it is possible to use flat mirrors having various incident angle characteristics.

Figure 6:
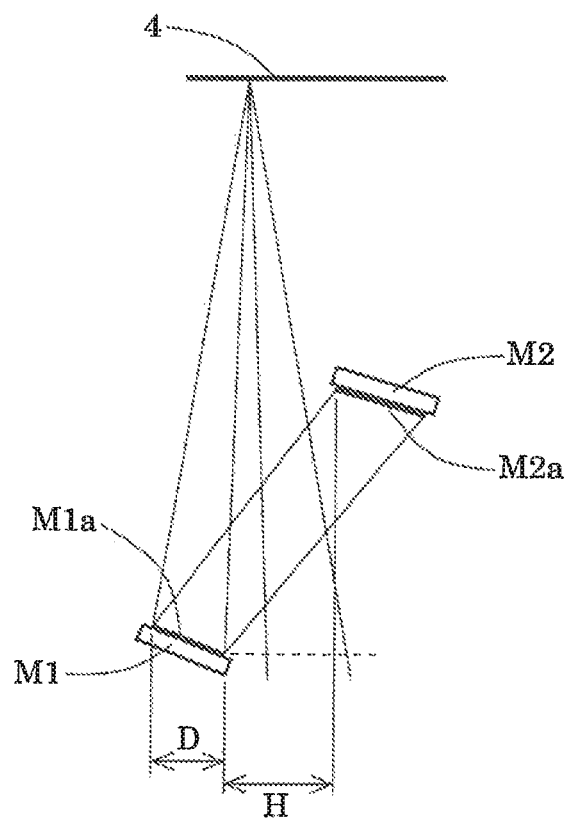
FIG. 6 is a drawing to explain a conditional expression in the embodiment.

In this embodiment, as shown in FIG. 6, in a case that a distance, in the Y direction, between a reflection area M1a of the first reflecting mirror M1 and a reflection area M2a of the second reflecting mirror M2 is referred to as "H", and that the cross-section dimension of the reflection area M1a of the first reflecting mirror M1 in the Y direction is referred to as "D", the following conditional expression (1) may be satisfied.

$$0.5 < D/H < 1.1 \tag{1}$$

In a case that D/H becomes less than the lower limit of the conditional expression (1), the light coming into the mask 4 passes between the first reflecting mirror M1 and second reflecting mirror M2 at a position where the cross-section dimension D is relatively small, that is, a position which is relatively close to the mask 4. Thus, there is fear that the second reflecting mirror M2 is too close to the mask 4 to arrange. Or, the distance H becomes relatively large to make the incident angle of the light beam coming into the mask 4 and the incident angle of the light beam coming into the first reflecting mirror M1 large. Thus, the reflectance in the mask 4 and the reflectance in the first reflecting mirror M1 are reduced, which could cause the decrease in throughput of the apparatus owing to the light amount loss in the mask 4 and the first reflecting mirror M1. Further, since the incident angle of the light beam coming into the mask 4 and the incident angle of the light beam coming into the first reflecting mirror M1 become large, there is fear that the image of the pattern of the mask 4 is not formed on the exposure surface of the wafer 7 with high accuracy due to the protrusions and recesses of the pattern of the mask 4. Examples of the case in which the image of the pattern of the mask 4 is not formed on the exposure surface of the wafer 7 with high accuracy due to the protrusions and recesses of the pattern of the mask 4 include the decrease in imaging performance due to the shadow caused by the protrusions and recesses of the pattern, the light amount loss caused by the interception or blocking of the light coming into the mask 4 owing to the protrusions and recesses of the pattern, and the like.

In a case that D/H exceeds the upper limit of the conditional expression (1), there is fear that the light coming into the mask 4 interferes with the first reflecting mirror M1 and the second reflecting mirror M2. Therefore, in a case that the conditional expression (1) is satisfied, the space between the mask 4 and the second reflecting mirror M2 can be secured. This brings an advantage such that the first reflecting mirror M1 and the second reflecting mirror M2 can be arranged easily. In the case that the conditional expression (1) is satisfied, it is possible to make the incident angle of the light beam coming into the mask 4 and the incident angle of the light beam coming into the first reflecting mirror M1 small. Thus, the decrease in reflectance in the mask 4 and the first reflecting mirror M1 can be suppressed, which improves the throughput of the exposure apparatus. Further, the deterioration in imaging due to the protrusions and recesses of the pattern of the mask 4 is suppressed, which makes it possible to form the image of the pattern of the mask 4 on the exposure surface of the wafer 7 with high accuracy. Furthermore, it is possible to suppress the influence caused when the light coming into the mask 4 interferes with the first reflecting mirror M1 and the second reflecting mirror M2. In order to obtain better effect of this embodiment, the lower limit of the conditional expression (1) may be set to 0.75 or 0.9. The cross-section dimension D may be the dimension of an area, in the Y direction, which is obtained by projecting the reflection area M1a of the first reflecting mirror M1 on a plane perpendicular to the optical axis. Or, the cross-section dimension D may be the dimension of an area, in the Y direction, which is positioned on the plane (depicted by the broken line extending horizontally in FIG. 6) including the position of the first reflecting mirror M1 and being perpendicular to the optical axis, and which is occupied by the light coming into the pattern surface of the mask 4. In this case, the position of the first reflecting mirror M1 may be a position, in the circumferential portion of the reflection area M1a of the first reflecting mirror M1, closest to the optical axis, or the position of the first reflecting mirror M1 may be a position, in the circumferential portion of the reflection area M1a of the first reflecting mirror M1, farthest away from the optical axis.

In the respective embodiments of the present teaching, an aspherical surface is expressed by the following numerical expression (a) provided that y represents the height in the direction perpendicular to the optical axis, z represents the distance (sag amount) along the optical axis from the tangent plane, at the apex of the aspherical surface, to the position on the aspherical surface at the height y, r represents the apex radius of curvature, κ represents the conical coefficient, and $C_n$ represents the n-order aspherical coefficient.

$$z = (y^2/r)/\{1 + \{1 - (1+\kappa)*y^2/r^2\}^{1/2}\} + C_4 \cdot y^4 + C_6 \cdot y^6 + C_8 \cdot y^8 + C_{10} \cdot y^{10} + C_{12} \cdot y^{12} + C_{14} \cdot y^{14} + C_{16} \cdot y^{16} \tag{a}$$

First Embodiment

FIG. 3 shows a construction of a reflective imaging optical system according to a first embodiment of the present teaching. With reference to FIG. 3, in the reflective imaging optical system 6 of the first embodiment, the light from the mask 4 is successively reflected by the concave reflecting surface of the first reflecting mirror M1, the convex reflecting surface of the second reflecting mirror M2, the concave reflecting surface of the third reflecting mirror M3, the concave reflecting surface of the fourth reflecting mirror M4, the convex reflecting surface of the fifth reflecting mirror M5, and the concave reflecting surface of the sixth reflecting mirror M6 and then the reflected light forms the intermediate image of the mask pattern.

The light from the intermediate image formed via the first reflective optical system G1 is successively reflected by the convex reflecting surface of the seventh reflecting mirror M7 and the concave reflecting surface of the eighth reflecting mirror M8, and then the reflected light forms the reduced image (secondary image) of the mask pattern on the wafer 7. In the first embodiment, the magnitude β of imaging magnification of the reflective imaging optical system 6 is ⅛, and the acute angle formed by the plane formed by extending the reflecting surface of the flat mirror 3 and the mask surface is 82 degrees. In the first embodiment, an aperture stop AS (not shown in the drawing) is arranged at a position of the reflecting surface of the fourth reflecting mirror M4 or at a position in the vicinity thereof. The aperture stop AS may be provided at a location between the third reflecting mirror M3 and the fourth reflecting mirror M4, a location between the fourth reflecting mirror M4 and the fifth reflecting mirror M5, a position conjugate to the reflecting surface of the fourth reflecting mirror M4 or a position in the vicinity thereof, or the like.

Table 1 described below shows values of items or elements of the reflective imaging optical system according to the first embodiment. In the column of the major items shown in Table 1, λ represents the wavelength of the exposure light, β represents the magnitude of the imaging magnification, NA represents the numerical aperture on the image side (wafer side), Y0 represents the radius (maximum image height) of the image circle IF on the wafer 7, LX represents the size or dimension in the X direction of the effective imaging area ER, and LY represents the size or dimension in the Y direction of the effective imaging area ER (widthwise dimension of the circular arc-shaped effective imaging area ER).

In the column of the optical member items shown in Table 1, the surface number represents the sequence or order of the reflecting surface as counted from the mask side in the direction in which the light travels from the mask surface as the object plane (pattern surface of the mask 4) to the wafer surface as the image plane (transfer surface of the wafer 7), r represents the apex radius of curvature (central radius of curvature: mm) of each of the reflecting surfaces, and d represents the spacing distance on the axis of each of the reflecting surfaces, i.e., the inter-surface spacing (mm). The sign of the inter-surface spacing d is changed every time when the reflection occurs. The radius of curvature of the surface convex towards the mask is set to be positive, and the radius of curvature of the surface concave from the mask is set to be negative, irrelevant to the direction of the incidence of the light.

In the column of the values corresponding to the conditional expression shown in Table 1, H represents the distance in the Y direction provided between the reflection area of the first reflecting mirror M1 and the reflection area of the second reflecting mirror M2 and D represents the cross-section dimension of the reflection area of the first reflecting mirror M1 in the Y direction. Further, as reference values, PD represents the distance (entrance pupil distance) along the optical axis between the entrance pupil and the mask surface, TT represents the distance (total length) along the optical axis between the mask surface and the wafer surface, and R represents the angle of incidence (rad) of the main light beam coming into the mask surface. The incident angle R shall take a negative value in a case that a main light beam reflected by the mask surface travels in a direction away from the optical axis AX. The foregoing notation also holds in Table 2 described later on in the same manner as described above.

TABLE 1

Major Items:

λ = 13.4 nm
β = 1/8
NA = 0.5
Y0 = 41.50 mm
LX = 13 mm
LY = 1.0 mm

TABLE 1-continued

Optical Member Items:

| Surface No. | r | d | Optical member |
|---|---|---|---|
|  | (mask surface) | 500.907 |  |
| 1 | −845.540 | −222.994 | (first reflecting mirror M1) |
| 2 | −603.806 | 744.907 | (second reflecting mirror M2) |
| 3 | −2020.053 | −521.813 | (third reflecting mirror M3) |
| 4 | 2387.067 | 402.377 | (fourth reflecting mirror M4) |
| 5 | 626.102 | −769.948 | (fifth reflecting mirror M5) |
| 6 | 1091.832 | 1232.057 | (sixth reflecting mirror M6) |
| 7 | 321.642 | −249.299 | (seventh reflecting mirror M7) |
| 8 | 312.976 (wafer surface) | 279.299 | (eighth reflecting mirror M8) |

Aspherical Data:

First Surface:

$\kappa = 0$
$C_4 = -1.144837 \times 10^{-10}$        $C_6 = 5.754085 \times 10^{-15}$
$C_8 = -3.181161 \times 10^{-20}$        $C_{10} = 8.709635 \times 10^{-26}$
$C_{12} = 1.427421 \times 10^{-31}$        $C_{14} = -1.571308 \times 10^{-36}$
$C_{16} = 2.986494 \times 10^{-42}$ Second Surface:

$\kappa = 0$
$C_4 = 3.088833 \times 10^{-9}$        $C_6 = -3.862657 \times 10^{-15}$
$C_8 = -6.508134 \times 10^{-20}$        $C_{10} = 1.362713 \times 10^{-24}$
$C_{12} = -1.364423 \times 10^{-29}$        $C_{14} = 7.539638 \times 10^{-35}$
$C_{16} = -1.736016 \times 10^{-40}$ Third Surface:

$\kappa = 0$
$C_4 = 4.963271 \times 10^{-10}$        $C_6 = -5.030842 \times 10^{-16}$
$C_8 = -5.182840 \times 10^{-21}$        $C_{10} = 1.059625 \times 10^{-25}$
$C_{12} = -1.865317 \times 10^{-30}$        $C_{14} = 2.229099 \times 10^{-35}$
$C_{16} = -1.077214 \times 10^{-40}$ Fourth Surface:

$\kappa = 0$
$C_4 = -1.827048 \times 10^{-9}$        $C_6 = -3.415226 \times 10^{-14}$
$C_8 = -7.848731 \times 10^{-19}$        $C_{10} = -4.096783 \times 10^{-23}$
$C_{12} = 2.385006 \times 10^{-27}$        $C_{14} = -2.702122 \times 10^{-31}$
$C_{16} = 8.240540 \times 10^{-36}$ Fifth Surface:

$\kappa = 0$
$C_4 = -1.6573.97 \times 10^{-10}$        $C_6 = -3.847514 \times 10^{-15}$
$C_8 = 1.539176 \times 10^{-21}$        $C_{10} = -1.124299 \times 10^{-25}$
$C_{12} = -1.652992 \times 10^{-29}$        $C_{14} = 7.264395 \times 10^{-34}$
$C_{16} = -8.630798 \times 10^{-39}$ Sixth Surface:

$\kappa = 0$
$C_4 = 5.036087 \times 10^{-13}$        $C_6 = 7.415084 \times 10^{-18}$
$C_8 = -3.171087 \times 10^{-23}$        $C_{10} = 1.080338 \times 10^{-28}$
$C_{12} = -2.093168 \times 10^{-34}$        $C_{14} = 2.262700 \times 10^{-40}$
$C_{16} = -1.018244 \times 10^{-46}$ Seventh Surface:

$\kappa = 0$
$C_4 = 1.730920 \times 10^{-8}$        $C_6 = 9.395766 \times 10^{-13}$
$C_8 = 2.795811 \times 10^{-17}$        $C_{10} = 9.026776 \times 10^{-22}$
$C_{12} = -7.149350 \times 10^{-25}$        $C_{14} = 1.275899 \times 10^{-28}$
$C_{16} = -1.905227 \times 10^{-32}$ Eighth Surface:

$\kappa = 0$
$C_4 = 4.947677 \times 10^{-10}$        $C_6 = 6.365871 \times 10^{-15}$
$C_8 = 7.433736 \times 10^{-20}$        $C_{10} = 6.347248 \times 10^{-25}$
$C_{12} = 1.849725 \times 10^{-29}$        $C_{14} = -1.997201 \times 10^{-34}$
$C_{16} = 5.448389 \times 10^{-39}$ TABLE 1-continued Values Corresponding to the Conditional Expression:

D = 59.120 mm
H = 80.829 mm
PD = 3269.1 mm
TT = 1395.5 mm
R = −0.100
(1) (D/H) = 0.73

In relation to the reflective imaging optical system of the first embodiment, the value of RMS (root mean square) of the wavefront aberration was determined for the respective points in the circular arc-shaped effective imaging area ER. As a result, the maximum value (worst value) was 0.0335λ (λ: wavelength of light=13.4 nm). That is, in the first embodiment, it is possible to secure the relatively large numerical aperture on the image side of 0.5, and it is possible to secure the circular arc-shaped effective imaging area of 13 mm×1.0 mm in which the various aberrations are satisfactorily corrected on the wafer. Further, in the first embodiment, a spacing distance of not less than 8 mm is secured between each of the reflecting mirrors and the light flux passing in the vicinity of each of the reflecting mirrors.

Second Embodiment

FIG. 4 shows a construction of a reflective imaging optical system according to a second embodiment of the present teaching. With reference to FIG. 4, in the reflective imaging optical system 6 according to the second embodiment, the light from the mask 4 is successively reflected by the concave reflecting surface of the first reflecting mirror M1, the convex reflecting surface of the second reflecting mirror M2, the convex reflecting surface of the third reflecting mirror M3, the concave reflecting surface of the fourth reflecting mirror M4, the convex reflecting surface of the fifth reflecting mirror M5, and the concave reflecting surface of the sixth reflecting mirror M6 and then the reflected light forms the intermediate image of the mask pattern.

The light from the intermediate image formed via the first reflective optical system G1 is successively reflected by the convex reflecting surface of the seventh reflecting mirror M7 and the concave reflecting surface of the eighth reflecting mirror M8, and then the reflected light forms the reduced image of the mask pattern on the wafer 7. In the second embodiment, the magnitude β of imaging magnification of the reflective imaging optical system 6 is ⅙, and the acute angle formed by the plane formed by extending the reflecting surface of the flat mirror 3 and the mask surface is 83 degrees. In the second embodiment also, an aperture stop AS (not shown in the drawing) is arranged at a position of the reflecting surface of the fourth reflecting mirror M4 or at a position in the vicinity thereof, in a similar manner as in the first embodiment. Table 2 described below shows values of items or elements of the reflective imaging optical system according to the second embodiment.

TABLE 2

Major Items:

λ = 13.4 nm
β = ⅙
NA = 0.5
Y0 = 38.50 mm
LX = 17.4 mm
LY = 1.0 mm

TABLE 2-continued

Optical Member Items:

| Surface No. | r | d | Optical member |
|---|---|---|---|
|  | (mask surface) | 366.0731 |  |
| 1 | −581.254 | −173.077 | (first reflecting mirror M1) |
| 2 | −504.217 | 186.217 | (second reflecting mirror M2) |
| 3 | 2858.152 | −279.214 | (third reflecting mirror M3) |
| 4 | 1048.798 | 548.844 | (fourth reflecting mirror M4) |
| 5 | 527.506 | −622.001 | (fifth reflecting mirror M5) |
| 6 | 1024.635 | 1376.692 | (sixth reflecting mirror M6) |
| 7 | 297.840 | −201.0245 | (seventh reflecting mirror M7) |
| 8 | 257.429 | 231.024 | (eighth reflecting mirror M8) |
|  | (wafer surface) |  |  |

Aspherical Data:

First Surface:

$\kappa = 0$
$C_4 = 6.334772 \times 10^{-10}$          $C_6 = 4.053272 \times 10^{-15}$
$C_8 = -7.133735 \times 10^{-20}$         $C_{10} = 4.505447 \times 10^{-25}$
$C_{12} = 5.903391 \times 10^{-30}$       $C_{14} = -9.187387 \times 10^{-35}$
$C_{16} = 3.506429 \times 10^{-40}$ Second Surface:

$\kappa = 0$
$C_4 = 1.052386 \times 10^{-8}$           $C_6 = -1.895379 \times 10^{-13}$
$C_8 = 7.258412 \times 10^{-18}$          $C_{10} = -2.430244 \times 10^{-22}$
$C_{12} = 5.402014 \times 10^{-27}$       $C_{14} = -6.950205 \times 10^{-32}$
$C_{16} = 3.953995 \times 10^{-37}$ Third Surface:

$\kappa = 0$
$C_4 = 8.030029 \times 10^{-9}$           $C_6 = -4.277496 \times 10^{-14}$
$C_8 = 1.207719 \times 10^{-18}$          $C_{10} = -1.625005 \times 10^{-22}$
$C_{12} = 1.515615 \times 10^{-26}$       $C_{14} = -7.180262 \times 10^{-31}$
$C_{16} = 1.457437 \times 10^{-35}$ Fourth Surface:

$\kappa = 0$
$C_4 = -1.883268 \times 10^{-9}$          $C_6 = -5.233724 \times 10^{-14}$
$C_8 = -1.628503 \times 10^{-18}$         $C_{10} = -8.808161 \times 10^{-23}$
$C_{12} = 3.386588 \times 10^{-27}$       $C_{14} = -6.590832 \times 10^{-31}$
$C_{16} = 1.746258 \times 10^{-35}$ Fifth Surface:

$\kappa = 0$
$C_4 = -1.345956 \times 10^{-9}$          $C_6 = -3.897405 \times 10^{-17}$
$C_8 = 4.264561 \times 10^{-21}$          $C_{10} = -4.238677 \times 10^{-25}$
$C_{12} = 6.574421 \times 10^{-30}$       $C_{14} = -6.369767 \times 10^{-35}$
$C_{16} = 3.112936 \times 10^{-40}$ Sixth Surface:

$\kappa = 0$
$C_4 = -4.780883 \times 10^{-12}$         $C_6 = -1.808289 \times 10^{-18}$
$C_8 = -1.356320 \times 10^{-23}$         $C_{10} = 3.000797 \times 10^{-29}$
$C_{12} = -6.505272 \times 10^{-35}$      $C_{14} = 6.859371 \times 10^{-41}$
$C_{16} = -3.918473 \times 10^{-17}$ Seventh Surface:

$\kappa = 0$
$C_4 = 2.767278 \times 10^{-8}$           $C_6 = 2.037818 \times 10^{-12}$
$C_8 = 4.818580 \times 10^{-47}$          $C_{10} = 1.116519 \times 10^{-20}$
$C_{12} = -8.332805 \times 10^{-24}$      $C_{14} = 2.030806 \times 10^{-27}$
$C_{16} = -2.880151 \times 10^{-31}$ Eighth Surface:

$\kappa = 0$
$C_4 = 7.979056 \times 10^{-10}$          $C_6 = 1.600529 \times 10^{-14}$
$C_8 = 2.902626 \times 10^{-19}$          $C_{10} = 2.810315 \times 10^{-24}$
$C_{12} = 2.205571 \times 10^{-28}$       $C_{14} = -4.796949 \times 10^{-33}$
$C_{16} = 1.422134 \times 10^{-37}$ TABLE 2-continued Values Corresponding to the Conditional Expression:

D = 56.463 mm
H = 54.874 mm
PD = 2163.4 mm
TT = 1433.5 mm
R = −0.105
(1) (D/H) = 1.03

In relation to the reflective imaging optical system of the second embodiment, the maximum value (worst value) of RMS of the wavefront aberration was 0.0266λ (λ: wavelength of light=13.4 nm). That is, also in the second embodiment, it is possible to secure the relatively large numerical aperture on the image side of 0.5 in the same manner as in the first embodiment, and it is possible to secure the circular arc-shaped effective imaging area of 17.4 mm×1.0 mm in which the various aberrations are satisfactorily corrected on the wafer. Further, in the second embodiment, a spacing distance of not less than 8 mm is secured between each of the reflecting mirrors and the light flux passing in the vicinity of each of the reflecting mirrors similar to the first embodiment.

In the respective embodiments described above, it is possible to secure the satisfactory imaging performance and the relatively large numerical aperture on the image side of 0.5, and it is possible to secure the circular arc-shaped effective imaging area of 13 mm×1.0 mm or 17.4 mm×1.0 mm in which the various aberrations are satisfactorily corrected on the wafer 7, with respect to the EUV light having the wavelength of 13.4 nm. Therefore, the pattern of the mask 4 can be transferred at the high resolution of not more than 0.1 μm by the scanning exposure to each of the exposure areas having the size of, for example, 13 mm×16.5 mm or 17.4 mm×22.0 mm on the wafer 7.

In the respective embodiments described above, the EUV light having the wavelength of 13.4 nm is used by way of example. However, there is no limitation to this. The present teaching is also applicable similarly or equivalently to a reflective imaging optical system which uses, for example, the EUV light having a wavelength of about 5 nm to 40 nm or any other light having an appropriate wavelength.

In the respective embodiments described above, the reflective imaging optical system 6 includes the eight reflecting mirrors M1 to M8 wherein the centers of curvature of the reflecting surfaces are arranged on the same axis (on the optical axis AX). However, at least one of the eight reflecting mirrors M1 to M8 may be provided such that the center of curvature of the reflecting surface is deviated or shifted from the optical axis AX. In the respective embodiments described above, all of the reflecting mirrors M1 to M8 have the reflecting surfaces formed along a surface which is infinite-fold rotational symmetry in relation to the optical axis AX. However, at least one of the reflecting mirrors M1 to M8 may have a reflecting surface formed along a surface which is n-fold rotational symmetry in relation to the optical axis AX ("n" is finite number, for example, one, two or three).

In the respective embodiments described above, the present teaching is applied to the reflective imaging optical system of the far pupil type. However, there is no limitation to this. The present teaching is also applicable similarly or equivalently to any reflective imaging optical system of the near pupil type. In the reflective imaging optical system of the near pupil type, the entrance pupil is positioned on a side of the optical system from the object plane.

In the reflective imaging optical system 6 according to each of the embodiments, the reflecting area of the first reflecting mirror M1 and the reflecting area of the second reflecting mirror M2 are positioned on the same side as the illumination objective area (illumination area) on the pattern surface of the mask M with respect to the optical axis AX of the reflective imaging optical system 6. The first reflecting mirror M1 and the second reflecting mirror M2 are arranged so that the optical path of the light coming from the illumination optical system IL is positioned therebetween. As a result, the angle formed by the optical path of the light coming into the flat mirror 3 of the illumination optical system IL and the optical axis AX of the reflective imaging optical system 6 can be suppressed to be small (82 to 83 degrees), and thus the footprint of the exposure apparatus can be suppressed to be small.

In the exposure apparatus of this embodiment, the EUV light is used as the exposure light. Thus, the pattern of the mask M can be projected onto the wafer W to expose the wafer W therewith at a high resolution by relatively moving the wafer W and the pattern of the mask M to be transferred relative to the reflective imaging optical system 6. As a result, a highly accurate device can be produced under the satisfactory exposure condition by using the scanning type exposure apparatus having a large resolving power.

The exposure apparatus of the embodiment described above is produced by assembling the various subsystems including the respective constitutive elements as defined in claims so that the predetermined mechanical accuracy, electric accuracy and optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits among the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. The exposure apparatus may be produced in a clean room in which the temperature, the cleanness, etc. are managed.

Figure 7:
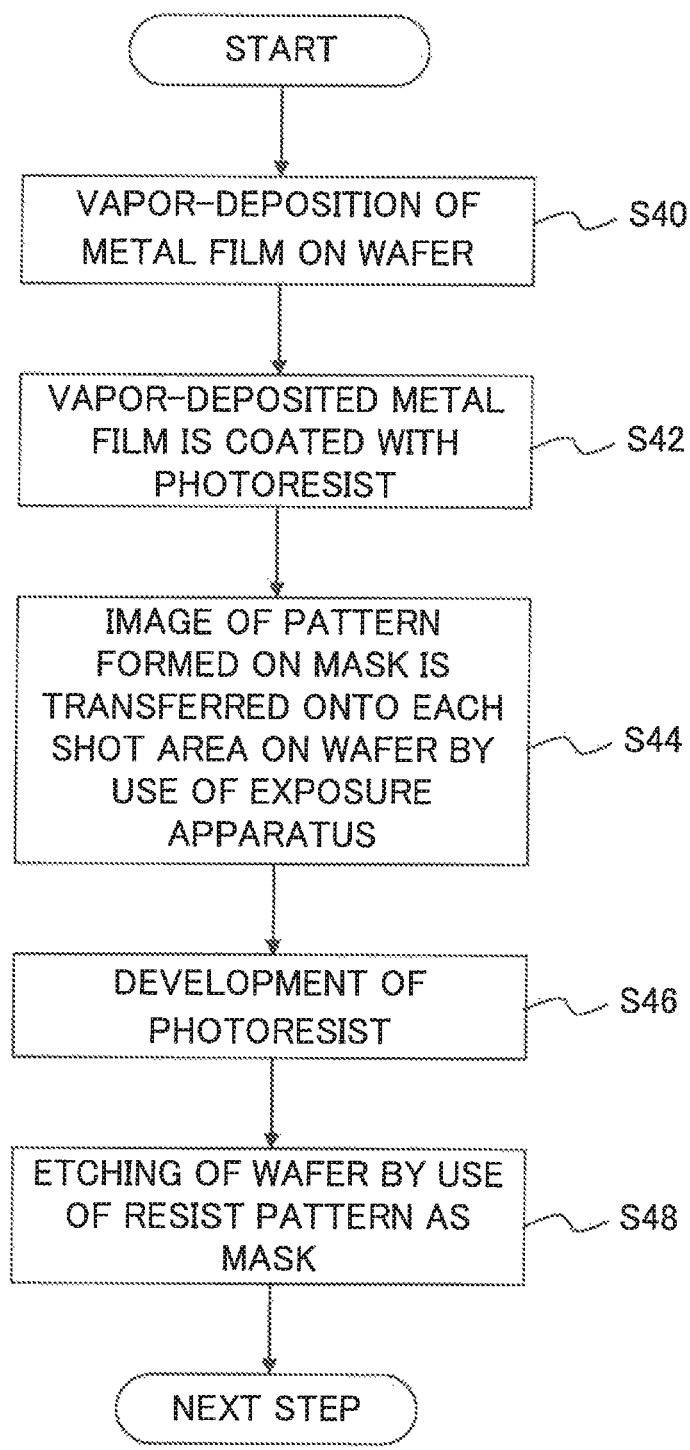
FIG. 7 is a flow chart concerning an exemplary technique adopted when a semiconductor device is obtained as a microdevice.

Next, an explanation will be made about a device production method using the exposure apparatus according to the embodiment described above. FIG. 7 shows a flow chart illustrating steps of producing a semiconductor device. As shown in FIG. 7, in the steps of producing the semiconductor device, a metal film is vapor-deposited on a wafer W which is to serve as a substrate of the semiconductor device (Step S40); and the vapor-deposited metal film is coated with a photoresist as a photosensitive material (Step S42). Subsequently, a pattern formed on a mask (reticle) M is transferred to each of shot areas on the wafer W by using the exposure apparatus of the embodiment described above (Step S44: exposure step). The wafer W for which the transfer has been completed is developed, i.e., the photoresist, to which the pattern has been transferred, is developed (Step S46: development step). After that, the resist pattern, which is formed on the surface of the wafer W in accordance with Step S46, is used as a mask to perform the processing including, for example, the etching with respect to the surface of the wafer W (Step S48: processing step).

The resist pattern herein refers to the photoresist layer formed with protrusions and recesses having shapes corresponding to the pattern transferred by the exposure apparatus of the embodiment described above, wherein the recesses penetrate through the photoresist layer. In Step S48, the surface of the wafer W is processed via the resist pattern. The processing, which is performed in Step S48, includes, for example, at least one of the etching of the surface of the wafer W and the film formation of a metal film or the like. In Step S44, the exposure apparatus of the embodiment described above transfers the pattern by using, as the photosensitive substrate, the wafer W coated with the photoresist.

In the embodiment described above, the laser plasma X-ray light source is used as the light source for supplying the EUV light. However, there is no limitation to this. It is also possible to use, for example, the synchrotron radiation (SOR) light as the EUV light.

In the embodiment described above, the present teaching is applied to the exposure apparatus having the light source for supplying the EUV light. However, there is no limitation to this. The present teaching is also applicable to an exposure apparatus having a light source for supplying a light having any wavelength other than the EUV light.

In the embodiment described above, it is possible to use a variable pattern-forming apparatus for dynamically forming a predetermined pattern based on predetermined electronic data, instead of using the mask M. It is possible to use, as such a variable pattern-forming apparatus, for example, a spatial light modulator including a plurality of reflecting elements which are driven based on predetermined electronic data. The exposure apparatus, which uses the spatial light modulator as the variable pattern-forming apparatus, is disclosed, for example, in United States Patent Application Publication Nos. 2007/0296936 and 2009/0122381. The disclosures of United States Patent Application Publication Nos. 2007/0296936 and 2009/0122381 are incorporated herein by reference in their entirety.

In the embodiment described above, the present teaching is applied to the reflective imaging optical system provided as the projection optical system of the exposure apparatus. However, there is no limitation to this. In general, the present teaching is also applicable similarly or equivalently to any reflective imaging optical system in which an image on the first plane at a predetermined area is formed on the second plane.

What is claimed is:

1. A reflective imaging optical system which forms, on an object, an image of a pattern in an illumination area illuminated by an illumination optical system, the reflective imaging optical system comprising:
    a first mirror by which a light reflected by the pattern is reflected first;
    a second mirror by which the light reflected by the pattern is reflected second;
    a third mirror by which the light reflected by the pattern is reflected third;
    a fourth mirror by which the light reflected by the pattern is reflected fourth;
    a fifth mirror by which the light reflected by the pattern is reflected fifth; and
    an aperture stop arranged between the third mirror and the fifth mirror, wherein
    the first, second and third mirrors are arranged in a first region which is one of two regions obtained by dividing a space in the reflective imaging optical system by a plane including an optical axis of the reflective imaging optical system and in which the illumination area is arranged.

2. The reflective imaging optical system according to claim 1, wherein the light which travels from the pattern to the first mirror is farther away from the optical axis as the light approaches the first mirror.

3. The reflective imaging optical system according to claim 1, wherein a light path of the light which travels from the first mirror to the second mirror intersects a light path of the illumination optical system.

4. The reflective imaging optical system according to claim 1, wherein, in a direction orthogonal to the plane including the optical axis, the second mirror is positioned between the first mirror and the optical axis.

5. The reflective imaging optical system according to claim 1, wherein, in a direction parallel to the optical axis, the first mirror is positioned between the image of the pattern and the second mirror.

6. The reflective imaging optical system according to claim 1, wherein the second mirror has a concave reflective surface.

7. The reflective imaging optical system according to claim 1, wherein the light which travels from the first mirror to the second mirror travels so as to approach the optical axis of the reflective imaging optical system.

8. The reflective imaging optical system according to claim 1, wherein the light which travels from the second mirror to the third mirror travels so as to approach the optical axis of the reflective imaging optical system.

9. The reflective imaging optical system according to claim 1, wherein the fourth mirror is positioned on the optical axis of the reflective imaging optical system.

10. The reflective imaging optical system according to claim 1, wherein the light which travels from the illumination optical system to the pattern travels so as to travel away from the optical axis of the reflective imaging optical system.

11. The reflective imaging optical system according to claim 1, wherein the reflective imaging optical system includes eight mirrors in which the first, second, third, fourth and fifth mirrors are included.

12. A reflective imaging optical system which forms, on an object, an image of a pattern illuminated by an illumination optical system, the reflective imaging optical system comprising:
    a first mirror by which a light reflected by the pattern is reflected first;
    a second mirror by which the light reflected by the pattern is reflected second;
    a third mirror by which the light reflected by the pattern is reflected third;
    a fourth mirror by which the light reflected by the pattern is reflected fourth; and
    a fifth mirror by which the light reflected by the pattern is reflected fifth, wherein
    a light path of the light which travels from the pattern to the third mirror does not intersect an optical axis of the reflective imaging optical system, and
    a light path of the light which travels from the third mirror to the fifth mirror intersects the optical axis of the reflective imaging optical system.

13. An exposure apparatus comprising:
an illumination optical system which illuminates a pattern on an object plane with a light from a light source; and
the reflective imaging optical system as defined in claim 1 which projects the pattern onto a photosensitive substrate disposed on an image plane.

14. The exposure apparatus according to claim 13, wherein the illumination optical system illuminates the pattern with a light having a wavelength of 5 nm to 40 nm.

15. A method for producing a device, the method comprising:
exposing a photosensitive substrate with a pattern by using the exposure apparatus as defined in claim 13,
developing the photosensitive substrate to which the pattern has been transferred to form a mask layer, which has a shape corresponding to the pattern, on a surface of the photosensitive substrate, and
processing the surface of the photosensitive substrate via the mask layer.

16. An image forming method for forming, on an object, an image of a pattern in an illumination area illuminated by an illumination optical system, the method comprising:
reflecting a light reflected by the pattern with a first mirror of a reflective imaging optical system;
reflecting the light reflected by the first mirror with a second mirror of the reflective imaging optical system;
reflecting the light reflected by the second mirror with a third mirror of the reflective imaging optical system;
reflecting the light reflected by the third mirror with a fourth mirror of the reflective imaging optical system;
reflecting the light reflected by the fourth mirror with a fifth mirror of the reflective imaging optical system; and
allowing the light which travels from the third mirror to the fifth mirror to travel through an aperture stop, wherein
the first, second and third mirrors are arranged in a first region which is one of two regions obtained by dividing a space in the reflective imaging optical system by a plane including an optical axis of the reflective imaging optical system and in which the illumination area is arranged.

17. An image forming method for forming, on an object, an image of a pattern illuminated by an illumination optical system, the method comprising:
reflecting a light reflected by the pattern with a first mirror of a reflective imaging optical system;
reflecting the light reflected by the first mirror with a second mirror of the reflective imaging optical system;
reflecting the light reflected by the second mirror with a third mirror of the reflective imaging optical system;
reflecting the light reflected by the third mirror with a fourth mirror of the reflective imaging optical system; and
reflecting the light reflected by the fourth mirror with a fifth mirror of the reflective imaging optical system, wherein
the light which travels from the pattern to the third mirror does not intersect an optical axis of the reflective imaging optical system, and
a light path of the light which travels from the third mirror to the fifth mirror intersects the optical axis of the reflective imaging optical system.

18. The method according to claim 16, wherein reflecting the light reflected by the first mirror with the second mirror includes reflecting the light reflected by the first mirror with a concave reflective surface.

19. An exposure method comprising:
illuminating a pattern on an object plane with a light from a light source; and
projecting the pattern onto a photosensitive substrate disposed on an image plane by using the method as defined in claim 16.

20. A method for producing a device, the method comprising:
exposing a photosensitive substrate with a pattern by using the exposure method as defined in claim 19,
developing the photosensitive substrate to which the pattern has been transferred to form a mask layer, which has a shape corresponding to the pattern, on a surface of the photosensitive substrate, and
processing the surface of the photosensitive substrate via the mask layer.

* * * * *